United States Patent
Wang

(10) Patent No.: US 8,149,022 B2
(45) Date of Patent: Apr. 3, 2012

(54) DIGITAL DELAY LINE BASED FREQUENCY SYNTHESIZER

(75) Inventor: Ping-Ying Wang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 170 days.

(21) Appl. No.: 12/021,306

(22) Filed: Jan. 29, 2008

(65) Prior Publication Data

US 2008/0191750 A1    Aug. 14, 2008

Related U.S. Application Data

(60) Provisional application No. 60/888,949, filed on Feb. 9, 2007.

(51) Int. Cl.
*H03B 21/00* (2006.01)
*H03L 7/06* (2006.01)
*H03D 3/02* (2006.01)

(52) U.S. Cl. ........ 327/105; 327/158; 327/161; 327/277; 327/299; 375/376

(58) Field of Classification Search .......... 327/105–107, 327/147, 149, 152, 153, 156–158, 176, 277, 327/298, 299; 375/376
See application file for complete search history.

(56) References Cited

U.S. PATENT DOCUMENTS

| | | | |
|---|---|---|---|
| 4,975,931 A * | 12/1990 | Cosand | 377/52 |
| 5,202,642 A | 4/1993 | Dixon | |
| 5,889,436 A | 3/1999 | Yeung | |
| 6,072,347 A | 6/2000 | Sim | |
| 6,359,950 B2 * | 3/2002 | Gossmann et al. | 375/376 |
| 6,445,232 B1 * | 9/2002 | Logue et al. | 327/158 |
| 6,504,498 B1 * | 1/2003 | O'Brien | 341/143 |
| 6,856,791 B2 | 2/2005 | Klemmer | |
| 7,138,838 B2 * | 11/2006 | Shibahara et al. | 327/157 |
| 7,274,231 B1 * | 9/2007 | Gillespie et al. | 327/158 |
| 2009/0072913 A1 | 3/2009 | Eikenbroek | |

FOREIGN PATENT DOCUMENTS

| | | |
|---|---|---|
| CN | 1643789 | 7/2005 |
| CN | 1768479 | 5/2006 |
| DE | 103 26 164 A1 | 12/2004 |
| WO | 0161858 A1 | 8/2001 |

* cited by examiner

*Primary Examiner* — Lincoln Donovan
*Assistant Examiner* — Colleen O Toole
(74) *Attorney, Agent, or Firm* — Winston Hsu; Scott Margo

(57) ABSTRACT

A frequency synthesizer is disclosed. The frequency synthesizer includes a period control word generator, a delta-sigma modulator, and a delay line unit. The period control word generator generates a period control word. The delta-sigma modulator receives the period control word and generates a phase selection signal. The delay line unit generates an output clock based on the phase selection signal. The delta-sigma modulator performs a carry-in operation based on a base number and the base number is adjustable and determined by a calibration process of the delay line unit.

20 Claims, 10 Drawing Sheets

DIGITAL DELAY LINE BASED FREQUENCY SYNTHESIZER

CROSS REFERENCE TO RELATED APPLICATIONS

The application claims the benefit of U.S. Provisional Application No. 60/888,949, which was filed on Feb. 9, 2007 and is included herein by reference.

BACKGROUND

The present invention relates to a frequency synthesizer, and more particularly to an all-digital frequency synthesizer capable of performing a high-reliability operation.

With the development of modern multimedia entertainment systems, lots of efforts have been placed to meet the increasing demands on the resolution, bandwidth, and switching speed of frequency synthesizers. Traditionally, these requirements are achieved with the aid of the classical analog phase-locked loop (APLL) frequency synthesizer. However, the switching speed and resolution of synthesizers are becoming critically important, and conventional APLLs are not suitable to these applications because they suffer an inability to simultaneously provide fast frequency switching and high resolution without substantial design complexity. Furthermore, it is desirable to process signals all digitally to enhance noise immunity because of the relative parametric stability of digital circuits with aging and temperature variations. In addition, all-digital systems can be furnished by low supply voltage such as a voltage of 1.2V. Moreover, an all-digital circuit can be implemented with a resistor-transistor logic (RTL) based design having a feature of high productivity.

SUMMARY

According to one embodiment of the invention, a frequency synthesizer is disclosed. The frequency synthesizer comprises a period control word generator, a delta-sigma modulator, and a delay line unit. The period control word generator generates a period control word. The delta-sigma modulator receives the period control word and generates a phase selection signal. The delay line unit generates an output clock based on the phase selection signal. The delta-sigma modulator performs a carry-in operation based on a base number and the base number is adjustable and determined by a calibration process of the delay line unit.

According to another embodiment of the invention, a frequency synthesizer is disclosed. The frequency synthesizer comprises a period control word generator, a delta-sigma modulator, and a delay line unit. The period control word generator generates a period control word. The delta-sigma modulator receives the period control word and generates a phase selection signal. The delay line unit generates an output clock based on the phase selection signal. The period control word is adjustable to compensate for a temperature variation of delay time of the delay line unit.

According to another embodiment of the invention, a method for compensating for a temperature variation in a frequency synthesizer is disclosed. The method comprises the following steps. A relation between a period of a reference clock and minimum delay time of a delay line unit is obtained. A base number of a carry-in operation is determined based on the relation. The carry-in operation is performed by a delta-sigma modulator of the frequency synthesizer.

According to another embodiment of the invention, a method for compensating for a temperature variation in a frequency synthesizer is disclosed. The method comprises the following steps. A relation between a period of a reference clock and minimum delay time of a delay line unit is obtained. A period control word is determined based on the relation. The period control word is inputted into a delta-sigma modulator of the frequency synthesizer.

These and other objectives of the present embodiments will no doubt become obvious to those of ordinary skill in the art after reading the following detailed description of the preferred embodiment that is illustrated in the various figures and drawings.

DETAILED DESCRIPTION

The foregoing aspects and many of the attendant advantages of this disclosure will become more readily appreciated as the same becomes better understood by reference to the following detailed description, when taken in conjunction with the accompanying drawings.

Figure 1:
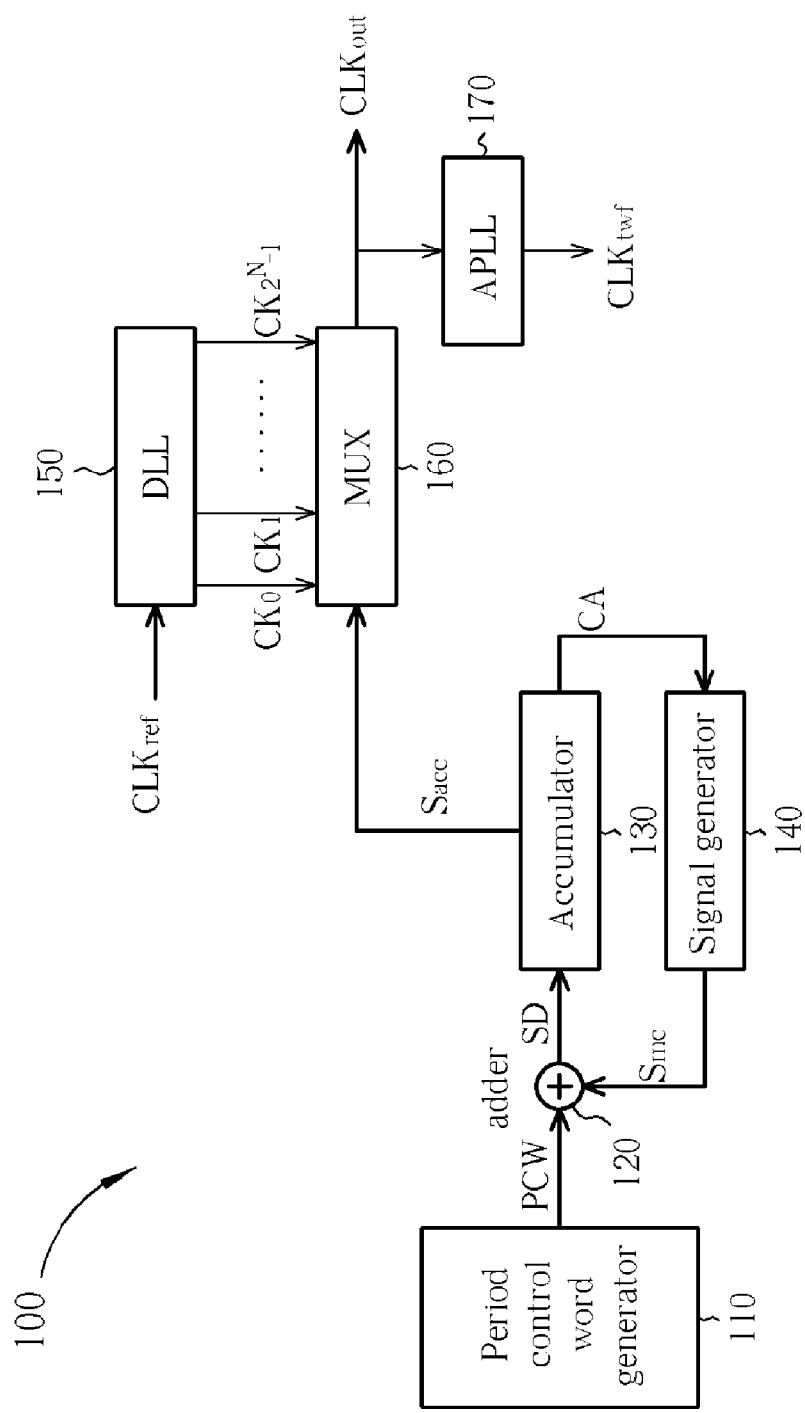
FIG. 1 shows the architecture of a frequency synthesizer according to an exemplary embodiment of the present invention.

Please refer to FIG. 1. FIG. 1 shows the architecture of a frequency synthesizer 100. The frequency synthesizer 100 comprises: a period control word generator 110, an adder 120 having a first input terminal coupled to the period control word generator 110; an accumulator 130; a signal generator 140 utilized to generate a control signal Smc coupled to a second input terminal of the adder 120; a delay locked loop (DLL) 150; a multiplexer (MUX) 160; and an analog phase locked loop (APLL) 170.

The period control word generator 110 is utilized to provide a period control word PCW that is furnished to the first input terminal of the adder 120. The adder 120 generates a difference signal SD by adding the period control word PCW with the control signal Smc. The accumulator 130 receives the difference signal SD from the adder 120 and adds the difference signal SD to a sum signal Sacc for accumulating the sum signal Sacc, which is assumed to be a K-bit signal where K is a positive integer, and generating a carry signal CA. Normally, the carry signal CA switches from a logic value "0" to a logic value "1" while occurring a carry-out process. However, the accumulator 130 can be designed to have a carry-out process based on a N-bit signal and the value of N can be chosen to be some positive integral number not greater than K. Therefore, the K-bit sum signal Sacc can be functioned as a N-bit sum signal Sacc.

The signal generator 140 functions to provide the control signal Smc, which is equal to a negative quantity of $2^N$ corresponding to the base carry number of the N-bit signal, to the adder 120 for enabling a carry-reset operation according to the carry signal CA generated by the accumulator 130. That is to say, the signal generator 140 furnishes a control signal Smc having a value of $-2^N$ to the adder 120 when the carry signal CA switches from a logic value "0" to a logic value "1", and the signal generator 140 furnishes a control signal Smc having a null value to the adder 120 otherwise.

The delay locked loop (DLL) 150 is clocked by a reference clock $CLK_{ref}$ having a preset frequency $f_{ref}$ and generates a plurality of multi-phase clocks $CK_0, CK_1 \ldots CK_{2^N-1}$ with same frequency according to the reference clock $CLK_{ref}$, which operation is also known to those skilled in the art and, for the sake of brevity, further discussion on the operation is omitted.

The multiplexer (MUX) 160 is coupled to the accumulator 130 and the DLL 150 for receiving the N-bit sum signal Sacc as a selecting signal and the plurality of the clocks $CK_0, CK_1 \ldots CK_{2^N-1}$ as input signals, and selects one of the clocks $CK_0, CK_1 \ldots CK_{2^N-1}$ as the output clock $CLK_{out}$ according to the sum signal Sacc.

The analog phase locked loop (APLL) 170 receives the output clock $CLK_{out}$ and is capable of generating a secondary output clock $CLK_{twf}$ having a frequency twice the frequency of the output clock, which operation is also known to those skilled in the art and, for the sake of brevity, further discussion on the operation is omitted.

Figure 2:
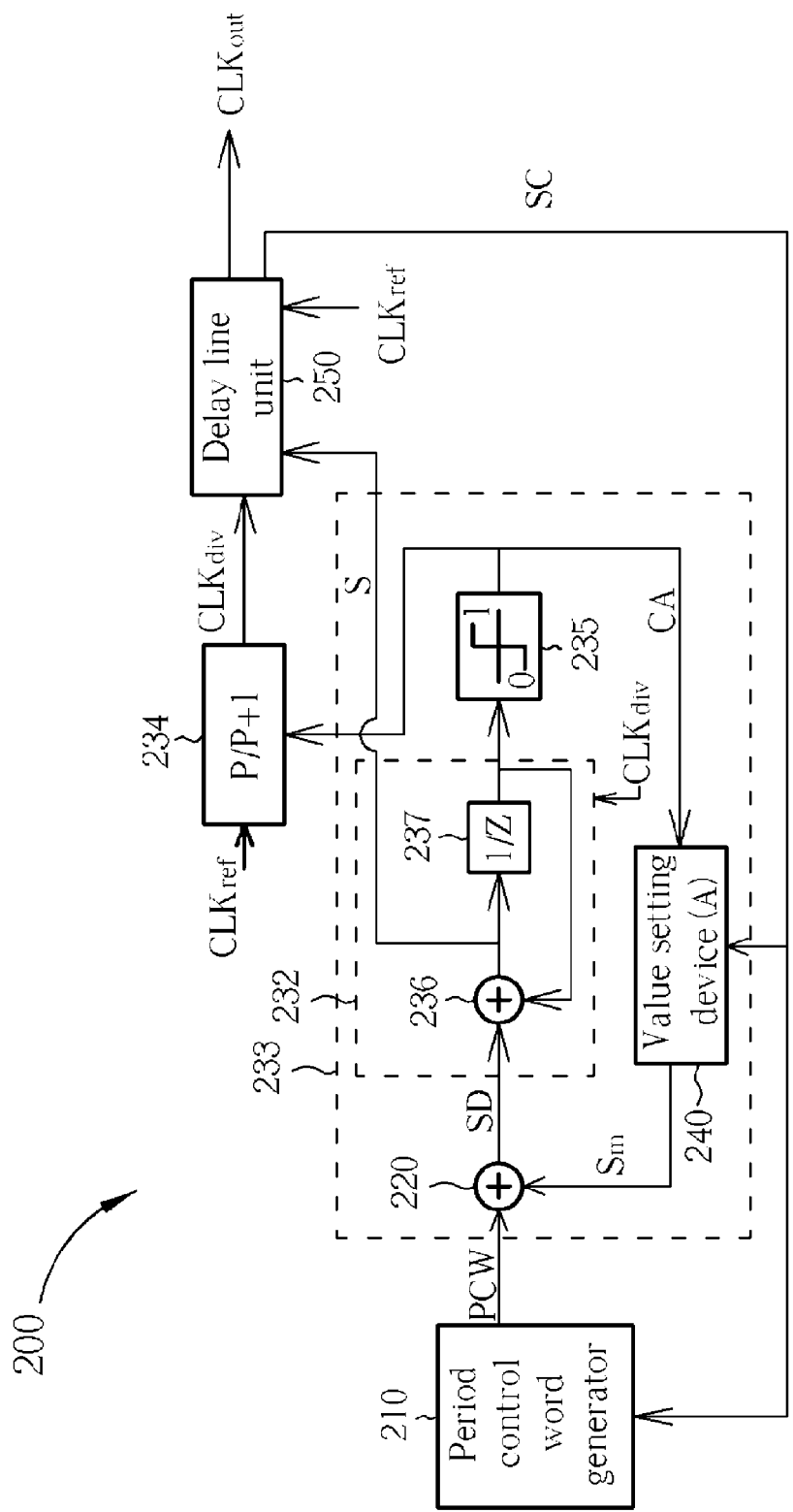
FIG. 2 illustrates the architecture of a frequency synthesizer according to an exemplary embodiment of the present invention.

FIG. 2 illustrates the architecture of a frequency synthesizer 200 according to an exemplary embodiment of the present invention. The frequency synthesizer 200 comprises a period control word (PCW) generator 210, a delta-sigma modulator 233, a frequency divider 234 and a delay line unit 250.

The period control word generator 210 provides the period control word PCW. The delta-sigma modulator 233 includes, for example, an adder 220, an accumulator 232, and a quantizer 235. The accumulator 232 is a well-known technology and can be implemented by an adder 236 and a 1/Z element 237. Other forms of delta-sigma modulator can be used based on different design choices. The frequency divider 234 divides a reference clock $CLK_{ref}$ into a first clock $CLK_{div}$ by P or P+1, where P is an integer. The delta-sigma modulator 233 is clocked by the first clock $CLK_{div}$.

The adder 220 generates a difference signal SD by subtracting a first control signal Sm from PCW. The delta-sigma modulator 233 generates a phase selection signal S, which is a K-bit signal in this embodiment. K is a positive integer. The delta-sigma modulator 233 also generates a carry signal CA. The divider 234 generates the first clock $CLK_{div}$ by performing a P or P+1 dividing process on the reference clock $CLK_{ref}$ based on the carry signal CA. For instance, the divider 234 generates the first clock $CLK_{div}$ by means of dividing the reference clock $CLK_{ref}$ by P when the carry signal CA is equal to logic value "0", and the divider 234 generates the first clock $CLK_{div}$ by means of dividing the reference clock $CLK_{ref}$ by P+1 when the carry signal CA is equal to logic value "1". Therefore, the divider 234 is substantially a P/P+1 counter, and the P/P+1 counter can be a ripple counter having a plurality of cascade-connected flip-flops for performing the P or P+1 dividing process on the reference clock $CLK_{ref}$.

The accumulator 232, clocked by the first clock $CLK_{div}$, accumulates the difference signal SD and generates the phase selection signal S. The phase selection signal S is used to select different phases of $CLK_{out}$ generated by the delay line unit 250. A predetermined value A could be set to the quantizer 235 to generate the carry signal CA. For example, if a value 55 (value A) is set to the quantizer 235, the carry signal CA is set to "1" whenever the output of the accumulator 232 reaches 55. A carry-in process is performed by the adder 220 by subtracting the first control signal Sm from the PCW. The first control signal Sm is set to the value A during a carry-in operation. Otherwise, the first control signal Sm is set to 0. Therefore, the accumulation and carry-in processes repeat periodically.

The value A is the base number or threshold for the carry-in process. The value A comes from the calibration result (a second control signal SC) of the delay line unit 250. The predetermined value A can be, for example, stored in a value setting device 240 and serves as the first control signal Sm.

The value A is usually not greater than the value of $2^K$. The chosen base number is not limited to the value of $2^N$ where the value of N can be some positive integer not greater than K.

Figure 3:
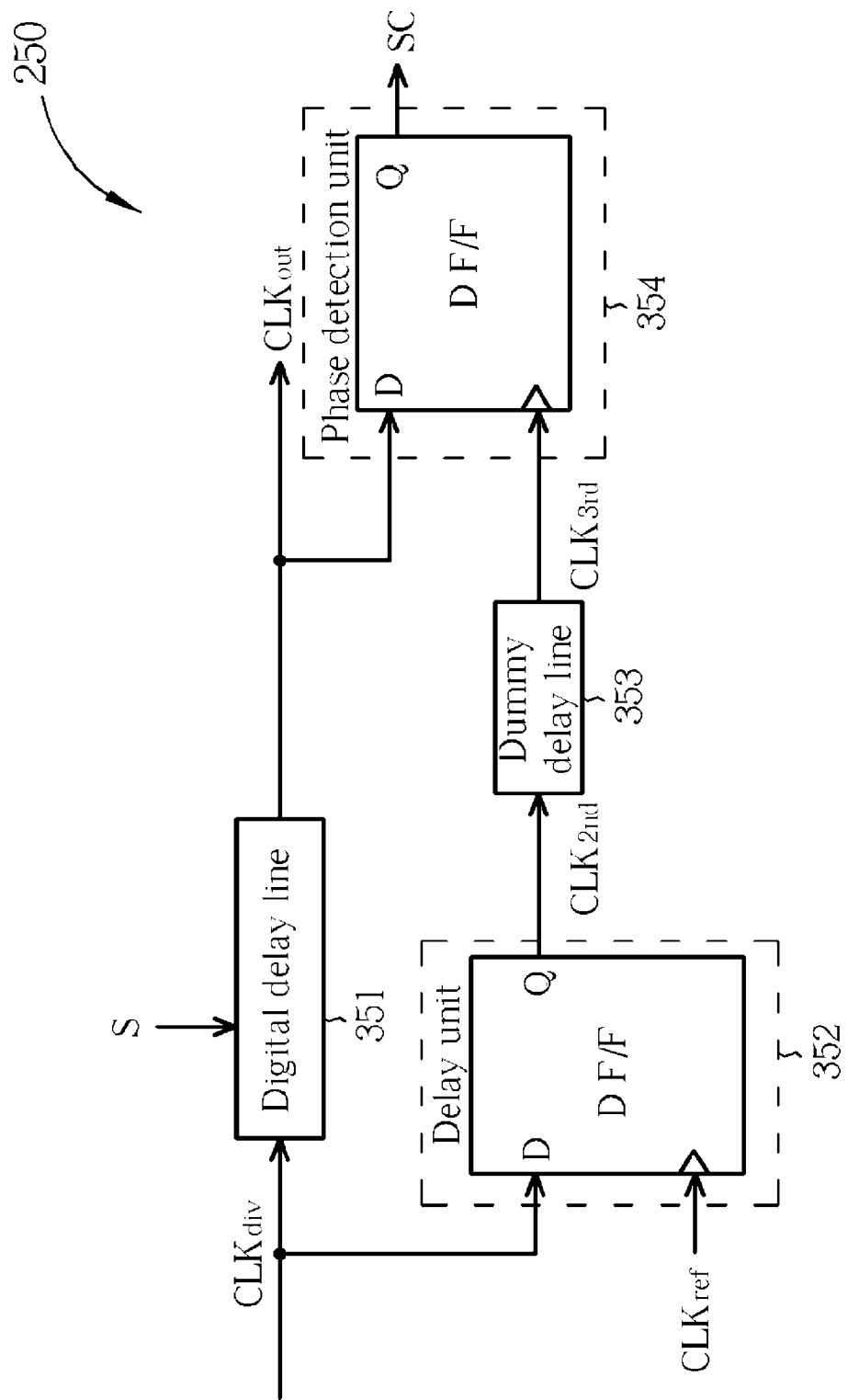
FIG. 3 illustrates the architecture of the delay line unit shown in FIG. 2 according to an exemplary embodiment of the present invention.

FIG. 3 illustrates the architecture of the delay line unit 250 according to an exemplary embodiment of the present invention. The delay line unit 250 comprises: a digital delay line 351, a delay unit 352, a dummy delay line 353, and a phase detection unit 354.

The digital delay line 351 receives the first clock $CLK_{div}$ and the phase selection signal S, and performs a delay process on the first clock $CLK_{div}$ to generate the output clock $CLK_{out}$.

Figure 4:
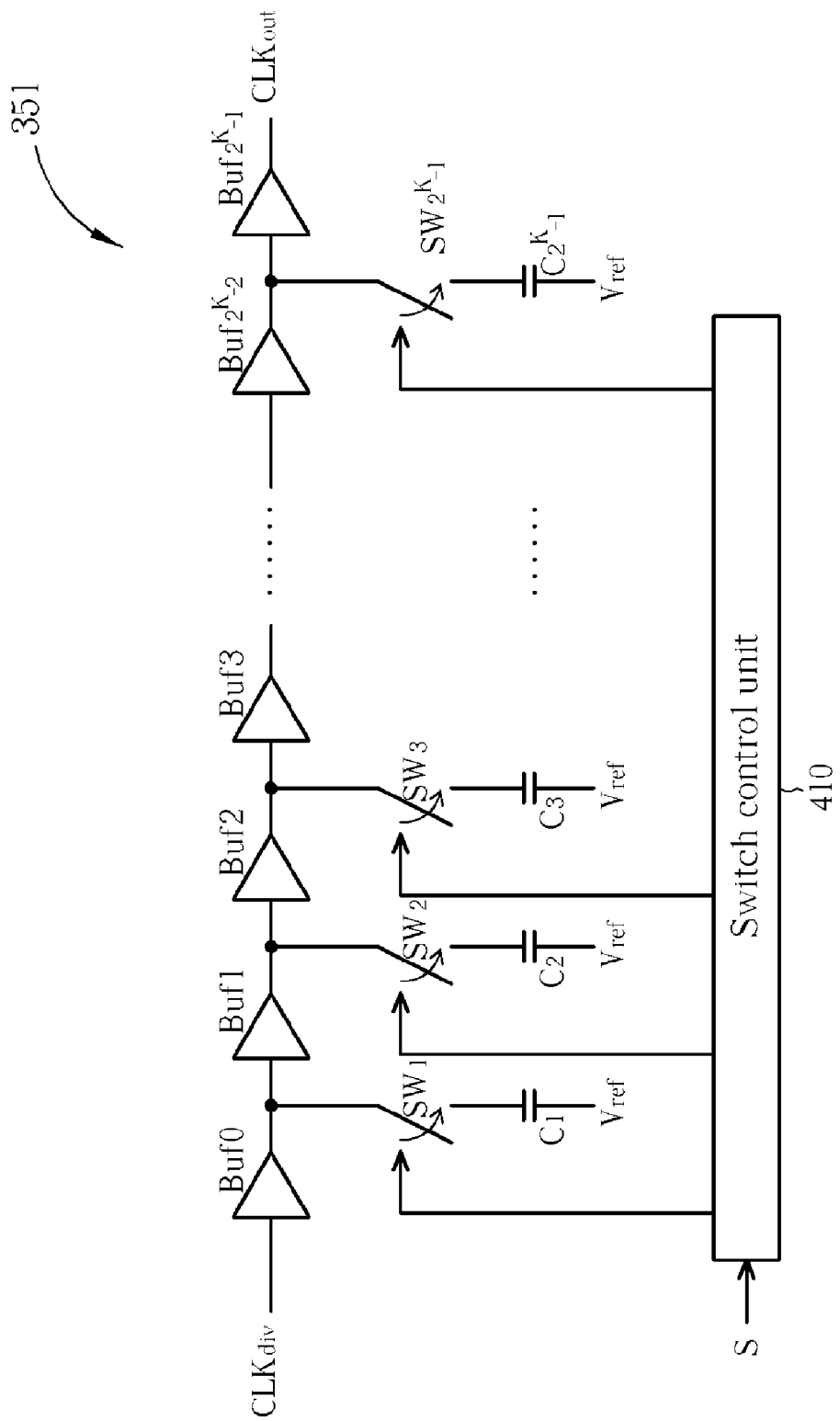
FIG. 4 illustrates the architecture of the digital delay line shown in FIG. 3 according to an exemplary embodiment of the present invention.

The architecture of the digital delay line 351 is schematically shown in FIG. 4. The digital delay line 351 comprises a plurality of cascade-connected buffer stages $Buf_0, Buf_1 \ldots Buf_{2^k-1}$, a plurality of capacitors $C_1, C_2 \ldots C_{2^k-1}$, a plurality of switches $SW_1, SW_2 \ldots SW_{2^k-1}$, and a switch control unit 410. Each of the plurality of switches $SW_1, SW_2 \ldots SW_{2^k-1}$ is series connected with one of the plurality of capacitors $C_1, C_2 \ldots C_{2^k-1}$, respectively. Furthermore, each of the plurality of the series-connected switches and capacitors is coupled to a reference voltage Vref and the corresponding interconnection node between adjacent buffer stages. The reference voltage Vref may be the ground voltage or the system power supply voltage. The switch control unit 410 is utilized to control the on-off state of the plurality of switches $SW_1, SW_2 \ldots SW_{2^k-1}$ with the aid of the phase selection signal S.

The on-off states of the plurality of switches $SW_1, SW_2 \ldots SW_{2^k-1}$ are utilized to control the delay process performed by the digital delay line 351. For instance, while the switch SWn is on, the delay process corresponding to the buffer stage Bufn concerns not only the delay caused by the buffer stage Bufn but also the delay caused by the charging and discharging effects of the corresponding capacitor Cn. However, while the switch SWn is off, the delay process corresponding to the buffer stage Bufn concerns only the delay caused by the buffer stage Bufn without the extra delay caused by the charging and discharging effects of the corresponding capacitor Cn.

During the period calibration process, the switch control unit 410 enacts a switch control process that turns on the switches sequentially one after another from SW1 to the following switches with the increasing phase selection signal S until the period calibration is finished. If the phase selection signal S is a K-bit signal, it can control up to $2^k$ switches in the delay line 351 to perform delay operations. Larger k value can control more switches, thus representing higher resolution. In addition, if the capacitance of the capacitors $C_1, C_2 \ldots C_{2^k-1}$ is smaller, then each extra delay corresponding to the on-state switch is also smaller, which means that the delay operation with smaller capacitance is corresponding to higher resolution for period calibration process.

The delay unit 352 clocked by the reference clock $CLK_{ref}$ receives the first clock $CLK_{div}$ and generates a delayed second clock $CLK_{2nd}$. The delayed second clock $CLK_{2nd}$ is delayed by the delay unit 352 with one period of the reference clock $CLK_{ref}$. The delay unit 352 is, for example, a D flip-flop.

The dummy delay line 353 receives the second clock $CLK_{2nd}$ and generates a delayed third clock $CLK_{3rd}$. The dummy delay line 353 can be the same as the digital delay line 351 shown in FIG. 4. In one embodiment, all switches in the dummy delay line 353 are switched off during calibration. That is, the delay of the dummy delay line 353 is caused purely by the plurality of cascade-connected buffer stages without any extra delay caused by the capacitors. Obviously, the inclusion or omission of components other than a similar plurality of cascade-connected buffer stages $Buf_0, Buf_1 \ldots Buf_{2^k-1}$ in the dummy delay line 353 may be regarded as a design choice.

The phase detection unit 354 receives the output clock $CLK_{out}$ and the third clock $CLK_{3rd}$, and generates the second control signal SC according to the phase relationship between the output clock $CLK_{out}$ and the third clock $CLK_{3rd}$. The phase detection unit 354 can be a D flip-flop. The rising edge of the third clock $CLK_{3rd}$ is utilized to latch the output clock $CLK_{out}$ and generates the second control signal SC.

As shown in FIG. 3 and FIG. 4, the delay concerning the output clock CLKout is caused by digital delay line 351 based on the plurality of the buffer stages $Buf_0, Buf_1 \ldots Buf_{2^k-1}$ with extra delay by the capacitors $C_1, C_2 \ldots C_{2^k-1}$ corresponding to the on-state switches. The delay concerning the third clock CLK3rd is caused by the dummy delay line 353 based on the plurality of the buffer stages $Buf_0, Buf_1 \ldots Buf_{2^k-1}$ with extra delay by the delay unit 352 having a delay of one period of the reference clock $CLK_{ref}$. The rising edge of the third clock $CLK_{3rd}$ will latch the high clock level of the output clock $CLK_{out}$ and generate the second control signal SC having a logic value "1".

That is, when all the switches $SW_1, SW_2 \ldots SW_{2^k-1}$ of the digital delay line 351 are off, the delay difference between the output clock $CLK_{out}$ and the third clock $CLK_{3rd}$ is one period of the reference clock $CLK_{ref}$. However, if the on-off states of the switches $SW_1, SW_2 \ldots SW_{2^k-1}$ are controlled to achieve an extra delay equal to one period of the reference clock $CLK_{ref}$, the output clock $CLK_{out}$ and the third clock $CLK_{3rd}$ turn out to be in phase with each other.

Therefore, as the plurality of the switches $SW_1, SW_2 \ldots SW_{2^k-1}$ of the digital delay line 351 is controlled to sequentially turn on one after one, the delay of the output clock $CLK_{out}$ increases gradually, and the delay difference between the output clock $CLK_{out}$ and the third clock $CLK_{3rd}$ is reduced gradually. While the delay difference between the output clock $CLK_{out}$ and the third clock $CLK_{3rd}$ is reduced to zero, the rising edge of the third clock $CLK_{3rd}$ will latch the low clock level of the output clock $CLK_{out}$ and generate the second control signal SC having a logic value "0". That is, the state of the second control signal SC of the phase detection unit 354 is switched to a complementary state. An all-digital period calibration process is now accomplished.

If td denotes the extra delay time introduced by a switched-on capacitor of the digital delay line 351, an integer value A will be obtained from the above calibration process where T=A*td. T is the period of the reference clock $CLK_{ref}$. That is, A td constitute a time period substantially equal to T. Therefore, the value A could be used as a base number for carrying in. In case of a temperature variation, a new A value can be determined by the above calibration process and serves as a new base number of the accumulator 232.

Furthermore, the second control signal SC can also be utilized to perform minor period correction on the output clock $CLK_{out}$. That is, when the delay caused by the operation processes of the frequency synthesizer 200 deviates from the desirable value due to device aging, temperature variation, or any other factors, the timing for the value setting device 240 to generate the first control signal Sm for carry-reset operation may deviate from a desirable situation due to variant latch timing for generating the second control signal SC from the delay line unit 250.

Under such circumstance, the period control word generator 210 is able to adjust the value of the period control word PCW according to the second control signal SC. For instance, if $T_{desirable}$ represents the desirable period of the output clock $CLK_{out}$ and $T_{variation}$ represents the variant period of the output clock $CLK_{out}$, then the period control word generator 210 is able to calculate a ratio R of $T_{variation}$ to $T_{desirable}$ and divide the period control word PCW by the ratio R to compensate the period variation of the output clock $CLK_{out}$ while the state of the second control signal SC is switched to a complementary state. Accordingly, the desirable period $T_{desirable}$ of the output clock $CLK_{out}$ is recovered from the variant period $T_{variation}$.

The all-digital frequency synthesizer 200 of an exemplary embodiment of the present invention can be applied to facilitate an all-digital duty-cycle correction circuit. The frequency synthesizer 200 can be modified to output a first auxiliary clock $CLK_0$ corresponding to a PCW having a null value and a second auxiliary clock $CLK_{180}$ corresponding to a PCW having a half predetermined value. Under such circumstance, the second auxiliary clock $CLK_{180}$ is having a phase shift of 180 degrees relative to the first auxiliary clock $CLK_0$.

Figure 5:
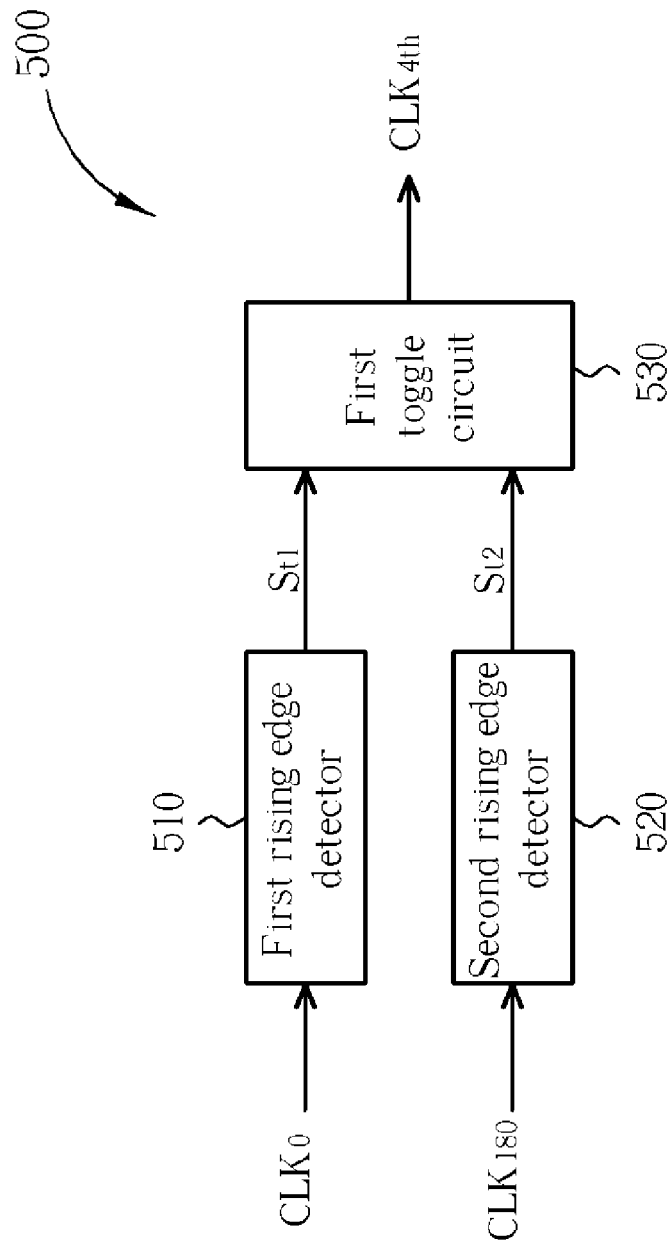
FIG. 5 shows a functional block diagram for all-digital duty cycle correction according to an exemplary embodiment of the present invention.

FIG. 5 shows a functional block diagram of the first auxiliary circuit 500. The first auxiliary circuit 500 comprises: a first rising edge detector 510, a second rising edge detector 520, and a first toggle circuit 530. The first rising edge detector 510 receives the first auxiliary clock $CLK_0$ and generates a first trigger signal St1 at the rising edges of the first auxiliary clock $CLK_0$. The second rising edge detector 520 receives the second auxiliary clock $CLK_{180}$ and generates a second trigger signal St2 at the rising edges of the second auxiliary clock $CLK_{180}$. The first toggle circuit 530 receives the first trigger signal St1 and the second trigger signal St2 and generates a fourth clock $CLK_{4th}$. The fourth clock $CLK_{4th}$ switches from "0" to "1" while receiving a pulse of the first trigger signal St1, and switches from "1" to "0" while receiving a pulse of the second trigger signal St2.

The circuits of the first rising detector 510 and the second rising edge detector 520 can be implemented by a straightforward logic circuit design as described below. The rising edge detector may comprises a 2-input AND gate and a NOT gate. The input clock of the rising edge detector is coupled both to the input of the NOT gate and to one input of the 2-input AND gate. The output of the NOT gate is coupled to the other input of the 2-input AND gate, and an output pulse can be generated at the output of the 2-input AND gate corresponding to the rising edge of the input clock. The operation of the aforementioned rising edge detector is well known to those skilled in the art and, for the sake of brevity, further discussion on the operation is omitted.

Figure 6:
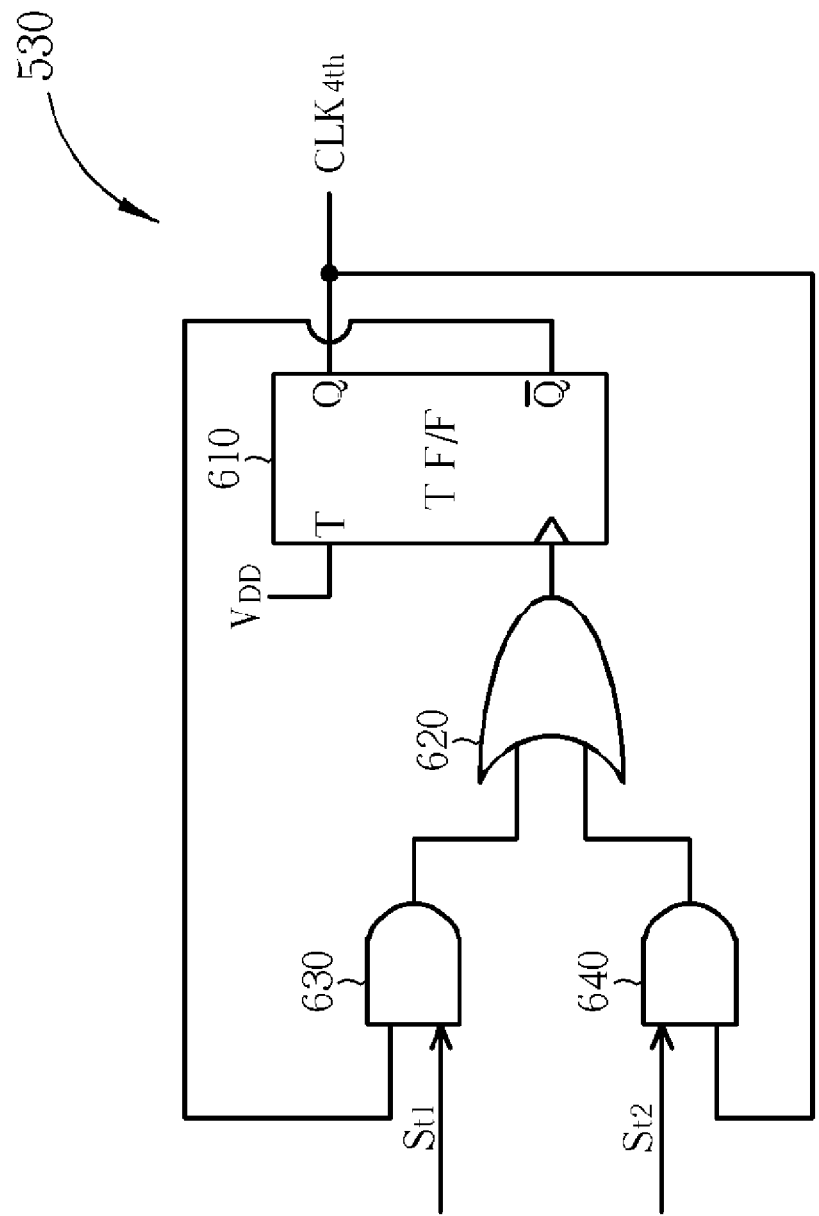
FIG. 6 shows the logic circuit design of the first toggle circuit shown in FIG. 5.

The first toggle circuit 530 can be implemented by the logic circuit design shown in FIG. 6. The first toggle circuit 530 shown in FIG. 6 comprises: a T flip-flop 610; a 2-input OR gate 620; a first 2-input AND gate 630; and a second 2-input AND gate 640. The T flip-flop 610 comprises: a T input terminal, a latch clock terminal, a first output node Q, and a second output node Qbar for outputting a logic signal complementary to a logic signal outputted at the first output node Q. The T flip-flop 610 changes output state on the occurring of the trigger pulse inputted to the latch clock terminal.

As the fourth clock $CLK_{4th}$ keeps a logic value "0", which means that the logic value of the first output Q is "0" and the logic value of the second output Qbar is "1", the second trigger signal St2 is disabled by the second 2-input AND gate 640 having an input equal to the first output Q with a logic value "0". However, the first trigger signal St1 is enabled by the first 2-input AND gate 630 having an input equal to the second output Qbar with a logic value "1".

Under such circumstance, the latch clock terminal of the T flip-flop 610 is controlled by the first trigger signal St1 through the first 2-input AND gate 630 and the 2-input OR gate 620. Consequently, when trigger pulses of the first trigger signal St1 are inputted to the latch clock terminal, the output state of the T flip-flop 610 is switched to a complementary state. That is, the logic value of the first output Q is switched to "1" and the logic value of the second output Qbar is switched to "0". Accordingly, the fourth clock $CLK_{4th}$ is switched to a logic value "1".

As the fourth clock $CLK_{4th}$ keeps a logic value "1", which means that the logic value of the first output Q is "1" and the logic value of the second output Qbar is "0", the second trigger signal St2 is then enabled by the second 2-input AND gate 640 having an input equal to the first output Q with a logic value "1". However, the first trigger signal St1 is disabled by the first 2-input AND gate 630 having an input equal to the second output Qbar with a logic value "0".

Under such circumstance, the latch clock terminal of the T flip-flop 610 is controlled by the second trigger signal St2 through the second 2-input AND gate 640 and the 2-input OR gate 620. Consequently, when trigger pulses of the second trigger signal St2 are inputted to the latch clock terminal, the output state of the T flip-flop 610 is switched to a complementary state. That is, the logic value of the first output Q is switched to "0" and the logic value of the second output Qbar is switched to "1". Accordingly, the fourth clock $CLK_{4th}$ is switched to a logic value "0".

In summary, the pulses of the first trigger signal St1 function to switch the fourth clock $CLK_{4th}$ from a logic value "0" to a logic value "1", and the pulses of the second trigger signal St2 function to switch the fourth clock $CLK_{4th}$ from a logic value "1" to a logic value "0".

According to the aforementioned, the time shift between the rising edge of the first auxiliary clock $CLK_0$ and the rising edge of the second auxiliary clock $CLK_{180}$ is exactly equal to a half of the period of the first auxiliary clock $CLK_0$. Therefore, the time shift between the first trigger signal St1 and the second trigger signal St2 is also exactly equal to a half of the period of the first auxiliary clock $CLK_0$.

Figure 7:
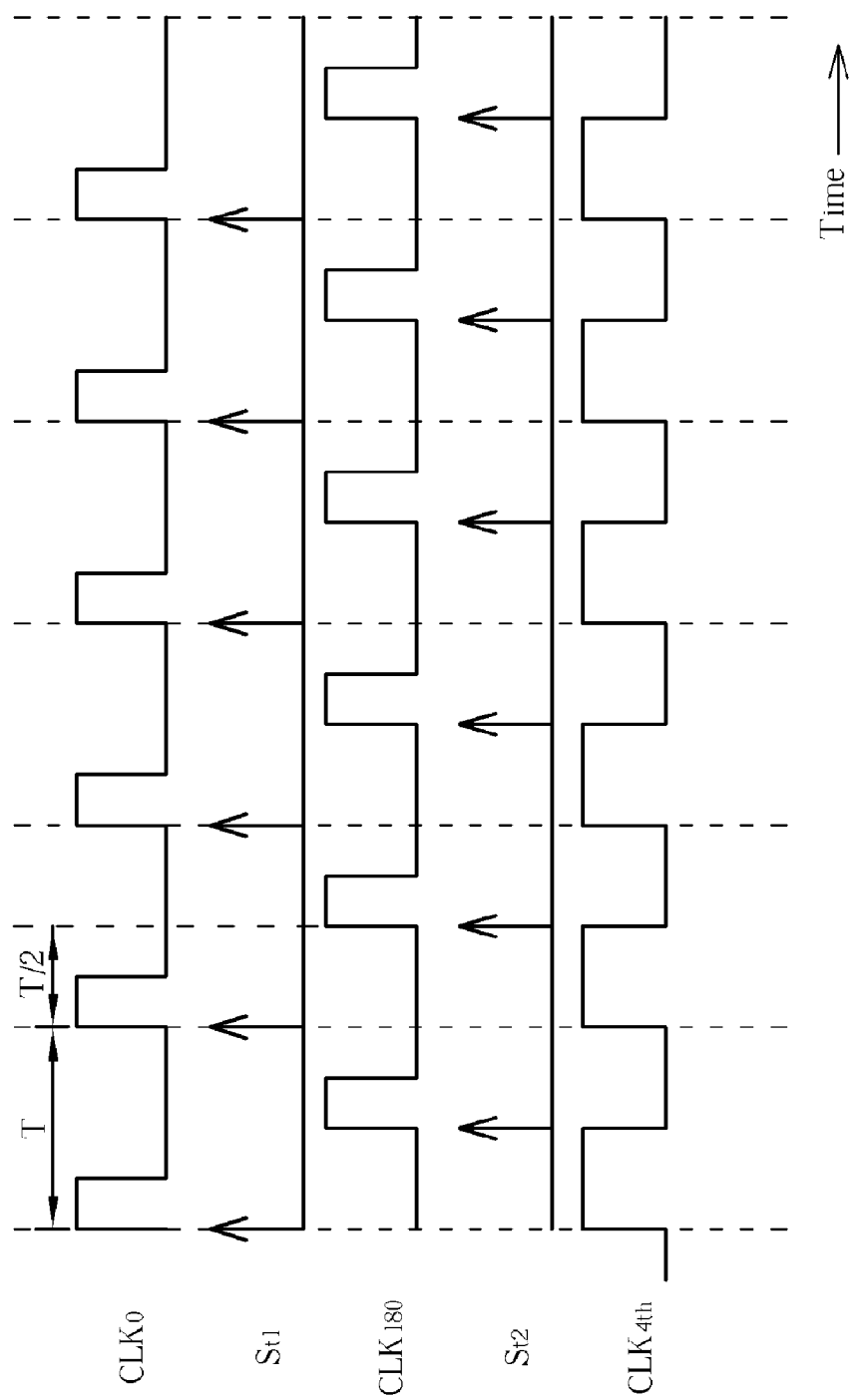
FIG. 7 shows the signal waveforms concerning the operation of the all-digital duty-cycle correction according to an exemplary embodiment of the present invention.

The signal waveforms concerning the operation of the duty-cycle correction circuit are shown in FIG. 7, having time along abscissa. The waveform diagrams in FIG. 7, from top to bottom, are the first auxiliary clock $CLK_0$, the first trigger signal St1, the second auxiliary clock $CLK_{180}$, the second trigger signal St2, the fourth clock $CLK_{4th}$. The first trigger signal St1 is shown in FIG. 7 as a series of pulses signified by a plurality of up-arrow symbols aligned to the rising edges of the first auxiliary clock $CLK_0$ respectively. The second trigger signal St2 is shown in FIG. 7 as a series of pulses signified by a plurality of up-arrow symbols aligned to the rising edges of the second auxiliary clock $CLK_{180}$ respectively. The fourth clock $CLK_{4th}$ switches from "0" to "1" corresponding to the occurring of the pulse of the first trigger signal St1 and switches from "1" to "0" corresponding to the occurring of the pulse of the second trigger signal St2. It is very obviously that the fourth clock $CLK_{4th}$ is shown to have a duty-cycle of exact 50%, which means that an all-digital duty-cycle correction process is accomplished.

In the embodiment of the first auxiliary circuit 500, under certain situation well known to those skilled in the art, the first auxiliary clock $CLK_0$ and the second auxiliary clock $CLK_{180}$ can be coupled directly to the first toggle circuit 530 without the aid of the first rising edge detector 510 and the second rising edge detector 520, wherein the fourth clock $CLK_{4th}$ switches from "0" to "1" while detecting the rising edge of the first auxiliary clock $CLK_0$ and switches from "1" to "0" while detecting the rising edge of the second auxiliary clock $CLK_{180}$.

The all-digital frequency synthesizer 200 of an exemplary embodiment of the present invention can be also applied to facilitate an all-digital frequency multiplier. The frequency synthesizer 200 can be modified to output a first auxiliary clock $CLK_0$ corresponding to a PCW having a null value, a second auxiliary clock $CLK_{180}$ corresponding to a PCW having a half predetermined value, a third auxiliary clock $CLK_{90}$ corresponding to a PCW having a quarter predetermined value, and a fourth auxiliary clock $CLK_{270}$ corresponding to a PCW having a three-quarter predetermined value.

Figure 8:
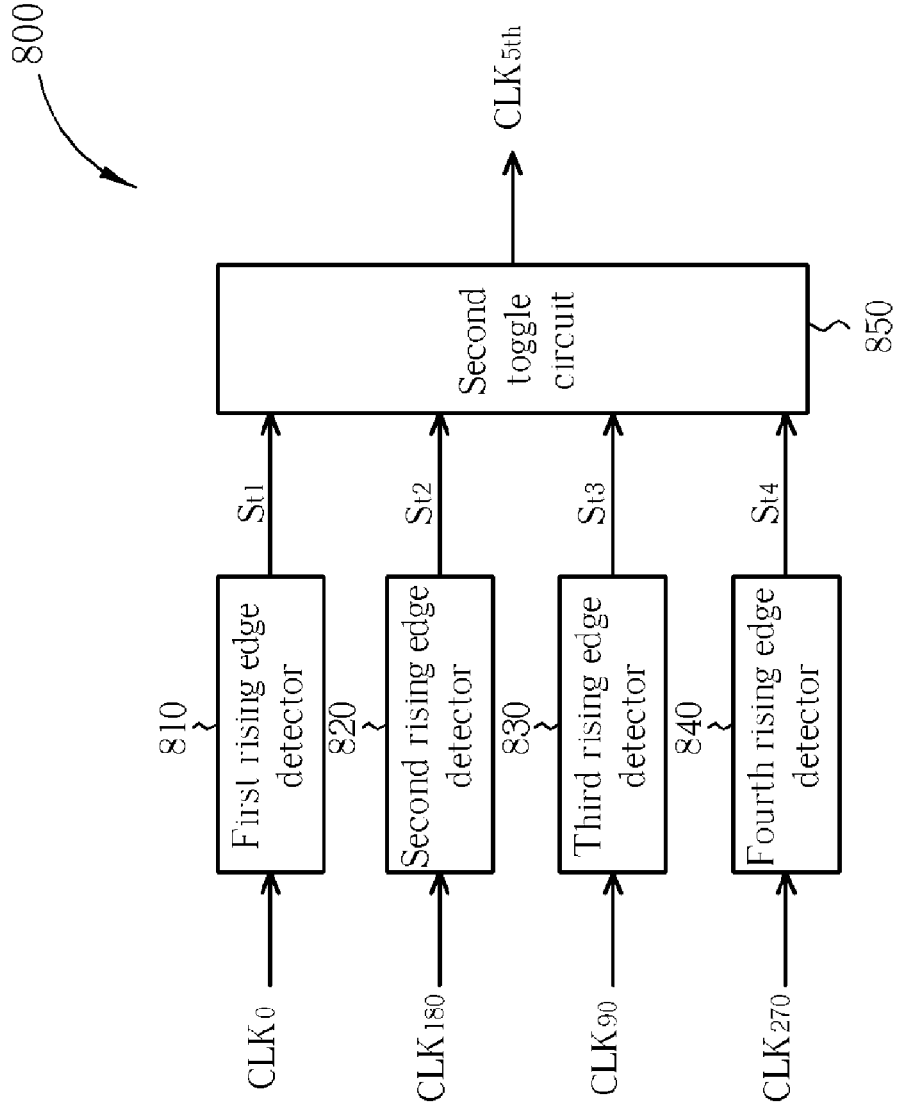
FIG. 8 shows a functional block diagram for an all-digital frequency multiplier according to an exemplary embodiment of the present invention.

Under such circumstance, the second auxiliary clock $CLK_{180}$ is having a phase shift of 180 degrees relative to the first auxiliary clock $CLK_0$, the third auxiliary clock $CLK_{90}$ is having a phase shift of 90 degrees relative to the first auxiliary clock $CLK_0$, and the fourth auxiliary clock $CLK_{270}$ is having a phase shift of 270 degrees relative to the first auxiliary clock $CLK_0$. The all-digital frequency multiplier comprises a second auxiliary circuit 800 shown in to FIG. 8. The second auxiliary circuit 800 comprises: a first rising edge detector 810, a second rising edge detector 820, a third rising edge detector 830, a fourth rising edge detector 840, and a second toggle circuit 850.

The first rising edge detector 810 receives the first auxiliary clock $CLK_0$ and generates a first trigger signal St1 at the rising edges of the first auxiliary clock $CLK_0$. The second rising edge detector 820 receives the second auxiliary clock $CLK_{180}$ and generates a second trigger signal St2 at the rising edges of the second auxiliary clock $CLK_{180}$. The third rising edge detector 830 receives the third auxiliary clock $CLK_{90}$ and generates a third trigger signal St3 at the rising edges of the third auxiliary clock $CLK_{90}$. The fourth rising edge detector 840 receives the fourth auxiliary clock $CLK_{270}$ and generates a fourth trigger signal St4 at the rising edges of the fourth auxiliary clock $CLK_{270}$. The second toggle circuit 850 receives the first trigger signal St1, the second trigger signal St2, the third trigger signal St3, and the fourth trigger signal St4, and generates a fifth clock $CLK_{5th}$. The fifth clock $CLK_{5th}$ switches from "0" to "1" while receiving a pulse of the first trigger signal St1 or the second trigger signal St2, and switches from "1" to "0" while receiving a pulse of the third trigger signal St3 or the fourth trigger signal St4.

The circuits of the first rising detector 810, the second rising edge detector 820, the third rising detector 830, and the fourth rising edge detector 840 can be implemented by a straightforward logic circuit design as described before and, for the sake of clarity, will not be repeated here.

Figure 9:
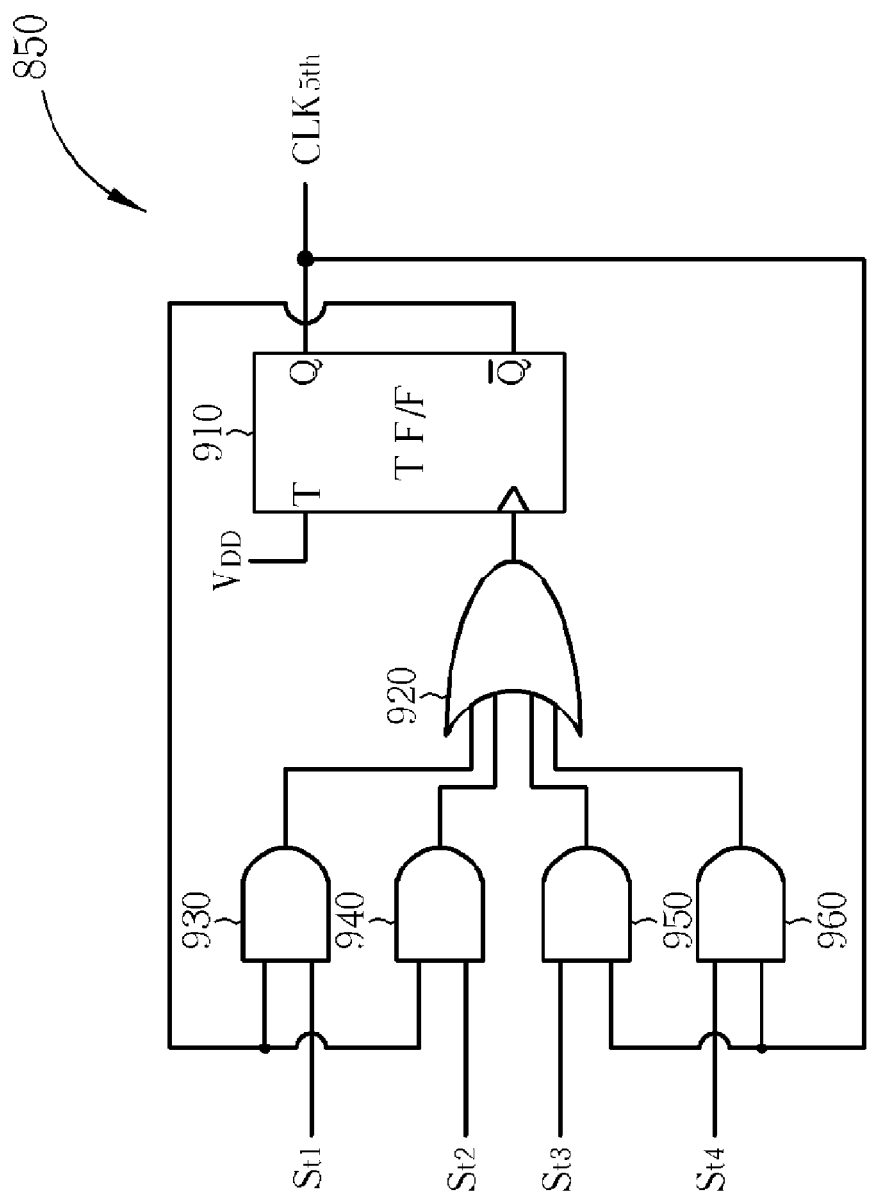
FIG. 9 shows the logic circuit design of the second toggle circuit shown in FIG. 8.

The second toggle circuit 850 can be implemented by the logic circuit design shown in FIG. 9. The second toggle circuit 750 shown in FIG. 9 comprises: a T flip-flop 910; a 4-input OR gate 920; a first 2-input AND gate 930; a second 2-input AND gate 940; a third 2-input AND gate 950; and a fourth 2-input AND gate 960. The T flip-flop 910 comprises: a T input terminal, a latch clock terminal, a first output node Q, and a second output node Qbar for outputting a logic signal complementary to a logic signal outputted at the first output node Q. The T flip-flop 910 changes output state on the occurring of the trigger pulse inputted to the latch clock terminal.

As the fifth clock $CLK_{5th}$ keeps a logic value "0", which means that the logic value of the first output Q is "0" and the logic value of the second output Qbar is "1", the third trigger signal St3 and the fourth trigger signal St4 are disabled respectively by the third 2-input AND gate 950 and the fourth 2-input AND gate 960 having an input equal to the first output Q with a logic value "0". However, the first trigger signal St1 and the second trigger signal St2 are enabled respectively by the first 2-input AND gate 930 and the second 2-input AND gate 940 having an input equal to the second output Qbar with a logic value "1".

Under such circumstance, the latch clock terminal of the T flip-flop 810 is controlled either by the first trigger signal St1 through the first 2-input AND gate 930 and the 4-input OR gate 920 or by the second trigger signal St2 through the second 2-input AND gate 930 and the 4-input OR gate 920. Consequently, when trigger pulses of the first trigger signal St1 or the second trigger signal St2 are inputted to the latch clock terminal, the output state of the T flip-flop 910 is switched to a complementary state. That is, the logic value of the first output Q is switched to "1" and the logic value of the second output Qbar is switched to "0". Accordingly, the fifth clock $CLK_{5th}$ is switched to a logic value "1".

As the fifth clock $CLK_{5th}$ keeps a logic value "1", which means that the logic value of the first output Q is "1" and the logic value of the second output Qbar is "0", the third trigger signal St3 and the fourth trigger signal St4 are then enabled respectively by the third 2-input AND gate 950 and the fourth 2-input AND gate 960 having an input equal to the first output Q with a logic value "1". However, the first trigger signal St1 and the second trigger signal St2 are disabled respectively by the first 2-input AND gate 930 and the second 2-input AND gate 940 having an input equal to the second output Qbar with a logic value "0".

Under such circumstance, the latch clock terminal of the T flip-flop 910 is controlled either by the third trigger signal St3 through the third 2-input AND gate 950 and the 4-input OR gate 920 or by the fourth trigger signal St4 through the fourth 2-input AND gate 960 and the 2-input OR gate 920. Consequently, when trigger pulses of the third trigger signal St3 or the fourth trigger signal St4 are inputted to the latch clock terminal, the output state of the T flip-flop 910 is switched to a complementary state. That is, the logic value of the first output Q is switched to "0" and the logic value of the second output Qbar is switched to "1". Accordingly, the fifth clock $CLK_{5th}$ is switched to a logic value "0".

In summary, the pulses of the first trigger signal St1 and the second trigger signal St2 function to switch the fifth clock $CLK_{5th}$ from a logic value "0" to a logic value "1", and the pulses of the third trigger signal St3 and the fourth trigger signal St4 function to switch the fifth clock $CLK_{5th}$ from a logic value "1" to a logic value "0".

According to the aforementioned, the time shift between the rising edge of the first auxiliary clock $CLK_0$ and the rising edge of the second auxiliary clock $CLK_{180}$ is exactly equal to a half of the period of the first auxiliary clock $CLK_0$, the time shift between the rising edge of the first auxiliary clock $CLK_0$ and the rising edge of the third auxiliary clock $CLK_{90}$ is exactly equal to a quarter of the period of the first auxiliary clock $CLK_0$, and the time shift between the rising edge of the first auxiliary clock $CLK_0$ and the rising edge of the fourth auxiliary clock $CLK_{270}$ is exactly equal to three quarters of the period of the first auxiliary clock $CLK_0$.

Therefore, the time shift between the first trigger signal St1 and the second trigger signal St2 is exactly equal to a half of the period of the first auxiliary clock $CLK_0$, the time shift between the first trigger signal St1 and the third trigger signal St3 is exactly equal to a quarter of the period of the first auxiliary clock $CLK_0$, and the time shift between the first trigger signal St1 and the fourth trigger signal St4 is exactly equal to three quarters of the period of the first auxiliary clock $CLK_0$.

Figure 10:
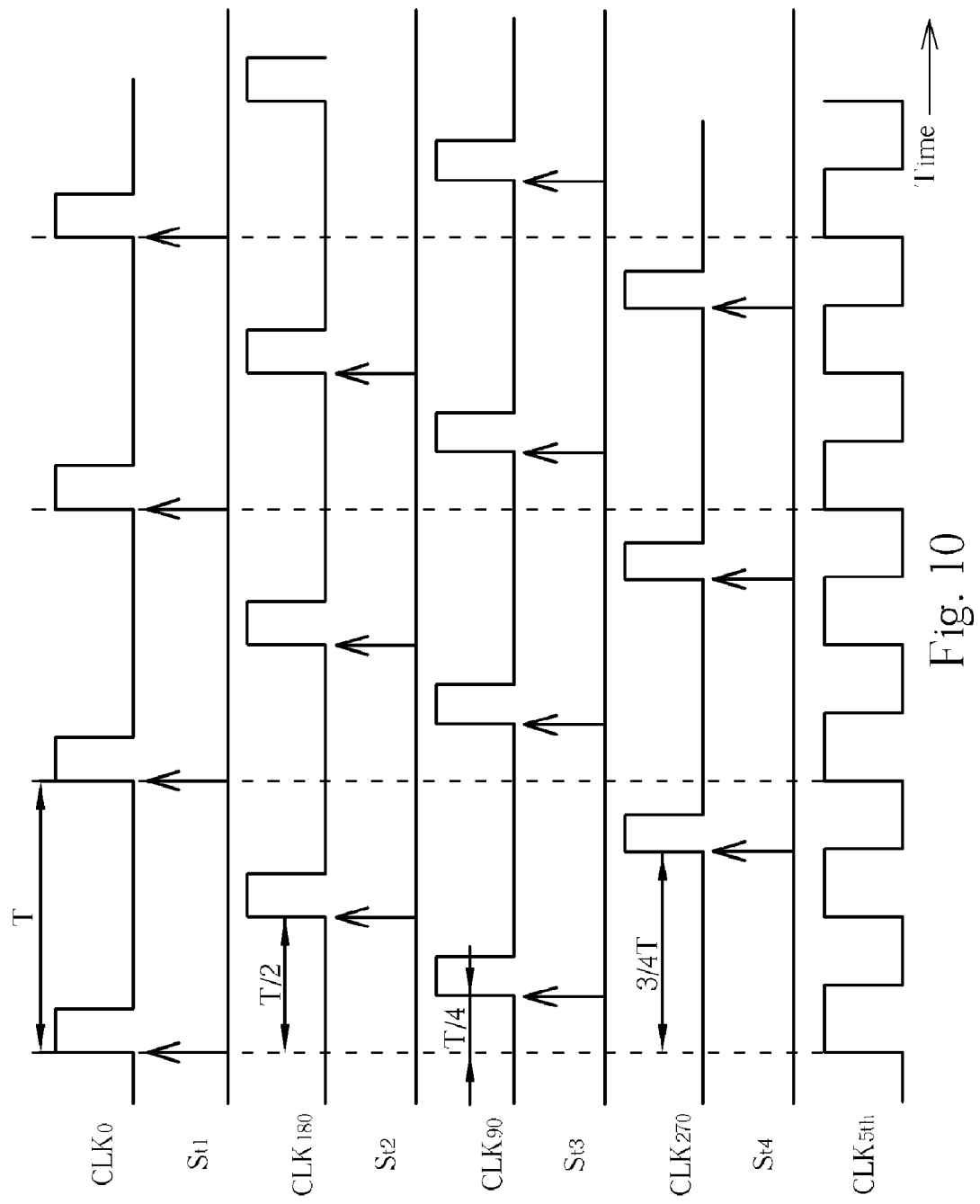
FIG. 10 shows the signal waveforms concerning the operation of the all-digital frequency multiplier according to an exemplary embodiment of the present invention.

The signal waveforms concerning the operation of the frequency multiplier are shown in FIG. 10, having time along abscissa. Please refer to the waveform diagrams shown in FIG. 10, having time along the abscissa. The waveform diagrams in FIG. 10, from top to bottom, are the first auxiliary clock $CLK_0$, the first trigger signal St1, the second auxiliary clock $CLK_{180}$, the second trigger signal St2, the third auxiliary clock $CLK_{90}$, the third trigger signal St3, the fourth auxiliary clock $CLK_{270}$, the fourth trigger signal St4, and the fifth clock $CLK_{5th}$.

The first trigger signal St1 is shown in FIG. 10 as a series of pulses signified by a plurality of up-arrow symbols aligned to the rising edges of the first auxiliary clock $CLK_0$ respectively. The second trigger signal St2 is shown in FIG. 10 as a series of pulses signified by a plurality of up-arrow symbols aligned to the rising edges of the second auxiliary clock $CLK_{180}$ respectively. The third trigger signal St3 is shown in FIG. 10 as a series of pulses signified by a plurality of up-arrow symbols aligned to the rising edges of the third auxiliary clock $CLK_{90}$ respectively. The fourth trigger signal St4 is shown in FIG. 10 as a series of pulses signified by a plurality of up-arrow symbols aligned to the rising edges of the fourth auxiliary clock $CLK_{270}$ respectively.

The fifth clock $CLK_{5th}$ switches from a logic value "0" to a logic value "1" corresponding to the occurring of the pulse of the first trigger signal St1 or the second trigger signal St2, and switches from a logic value "1" to a logic value "0" corresponding to the occurring of the pulse of the third trigger signal St3 or the fourth trigger signal St4. It is very obvious that the fifth clock $CLK_{5th}$ is shown to have a frequency twice the frequency of the first auxiliary clock $CLK_0$, which means that an all-digital frequency multiplier is accomplished.

In the embodiment of the second auxiliary circuit 800, under certain situation well known to those skilled in the art, the first auxiliary clock $CLK_0$, the second auxiliary clock $CLK_{180}$, the third auxiliary clock $CLK_{90}$, and the fourth auxiliary clock $CLK_{270}$ can be coupled directly to the second toggle circuit 850 without the aid of the first rising edge detector 810, the second rising edge detector 820, the third rising edge detector 830, and the fourth rising edge detector 840, wherein the fifth clock $CLK_{5th}$ switches from "0" to "1" while detecting the rising edge of the first auxiliary clock $CLK_0$ or the second auxiliary clock $CLK_{180}$, and switches from "1" to "0" while detecting the rising edge of the third auxiliary clock $CLK_{90}$ or the fourth auxiliary clock $CLK_{270}$.

As a result, the frequency synthesizer 200 of an exemplary embodiment of the present invention provides an all-digital system design to enhance noise immunity and achieve a high-reliability clock generator that can be implemented with a resistor-transistor logic (RTL) technology for high productivity.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A frequency synthesizer comprising:
a delta-sigma modulator for receiving a period control word and generating a phase selection signal; and
a delay line unit for generating an output clock and a second control signal based on the phase selection signal and a second clock, the delay line unit comprising:
a digital delay line for receiving the second clock and generating the output clock according to the phase selection signal;
a delay unit for receiving the second clock and generating a delayed second clock;
a dummy delay line for receiving the delayed second clock and generating a third clock; and
a phase detection unit for receiving the output clock and the third clock, and generating the second control signal according to a phase relationship between the output clock and the third clock;
wherein the delta-sigma modulator performs a carry-in operation based on a base number and the base number is adjustable and determined by a calibration process of the delay line unit, and the delta-sigma modulator comprises:
an adder for generating a difference signal by adding the period control word with a first control signal; and
a value setting device for generating the first control signal;
wherein the delta-sigma modulator generates a carry signal according to the difference signal, and the value setting device receives the carry signal and the second control signal, and provides the first control signal to the adder for performing the carry-in operation.

2. The frequency synthesizer of claim 1, further comprising a period control word generator for generating the period control word according to the second control signal.

3. The frequency synthesizer of claim 1, further comprising:
a divider for dividing a first clock into the second clock, the second clock being inputted into the delay line unit.

4. The frequency synthesizer of claim 3, further comprising a period control word generator for generating the period control word wherein the second control signal is transmitted to the period control word generator.

5. The frequency synthesizer of claim 1, wherein the delay unit comprises a D flip-flop for receiving the second clock at a D input terminal and a first clock at a latch clock terminal, and generating the delayed second clock through latching the second clock by the first clock.

6. The frequency synthesizer of claim 1, wherein the phase detection unit comprises a D flip-flop for receiving the output clock at a D input terminal and the third clock at a latch input terminal, and generates the second control signal through latching the output clock by the third clock.

7. The frequency synthesizer of claim 3, wherein the delta-sigma modulator further comprises:
an accumulator for receiving the difference signal from the adder, and generating the phase selection signal and the carry signal.

8. The frequency synthesizer of claim 7, wherein the divider is a P/P+1 counter, the P/P+1 counter receives the first clock and the carry signal, the P/P+1 counter generates the second clock by dividing the first clock by either P or P+1 according to the carry signal, the P/P+1 counter comprises a ripple counter having a plurality of cascade-connected flip-flops for performing a P or P+1 dividing process on the first clock.

9. The frequency synthesizer of claim 8, wherein the second clock is generated by means of dividing the first clock by P when the carry signal is equal to logic value "0", and the second clock is generated by means of dividing the first clock by P+1 when the carry signal is equal to value logic "1".

10. The frequency synthesizer of claim 2, wherein the second control signal is coupled to the period control word generator for adjusting the value of the period control word.

11. The frequency synthesizer of claim 1, further comprising:
a first auxiliary output terminal for generating a first auxiliary clock corresponding to a null period control word;
a second auxiliary output terminal for generating a second auxiliary clock corresponding to a half period control word;
a first rising edge detector for detecting rising edges of the first auxiliary clock and generating a first trigger signal;
a second rising edge detector for detecting rising edges of the second auxiliary clock and generating a second trigger signal; and
a toggle circuit for receiving the first and second trigger signals and generating a fourth clock having a duty cycle of about 50%;
wherein the fourth clock has a logic value of "1" when the toggle circuit receives a pulse of the first trigger signal and has a logic value of "0" when the toggle circuit receives a pulse of the second trigger signal.

12. The frequency synthesizer of claim 1, further comprising:
a first auxiliary output terminal for generating a first auxiliary clock corresponding to a null period control word;
a second auxiliary output terminal for generating a second auxiliary clock corresponding to a half period control word; and
a toggle circuit for receiving the first auxiliary clock and the second auxiliary clock, and generating a fourth clock having a duty cycle of about 50%;
wherein the fourth clock has a logic value of "1" when the toggle circuit detects the rising edge of the first auxiliary clock and has a logic value of "0" when the toggle circuit detects the rising edge of the second auxiliary clock.

13. A method for compensating for a temperature variation in a frequency synthesizer, the method comprising:
a delta-sigma modulator of the frequency synthesizer receiving a period control word and generating a phase selection signal;
a digital delay line of a delay line unit receiving a second clock and generating an output clock according to the phase selection signal;
a delay unit of the delay line unit receiving the second clock and generating a delayed second clock;
a dummy delay line of the delay line unit receiving the delayed second clock and generating a third clock;
a phase detection unit of the delay line unit receiving the output clock and the third clock, and generating a second control signal according to a phase relationship between the output clock and the third clock;

determining a base number of a carry-in operation based on the second control signal, the carry-in operation being performed by the delta-sigma modulator;

an adder of the delta-sigma modulator generating a difference signal by adding the period control word with a first control signal;

a value setting device of the delta-sigma modulator generating the first control signal;

the delta-sigma modulator generating a carry signal according to the difference signal; and the value setting device receiving the carry signal and the second control signal, and providing the first control signal to the adder for performing the carry-in operation.

14. The frequency synthesizer of claim 1, wherein the base number is adjusted according to the second control signal.

15. The method of claim 13, further comprising a period control word generator generating the period control word according to the second control signal.

16. The method of claim 15, wherein the period control word generator generating the period control word according to the second control signal comprises coupling the second control signal to the period control word generator for adjusting the value of the period control word.

17. The method of claim 13, further comprising a divider dividing a first clock into the second clock, the second clock being inputted into the delay line unit.

18. The method of claim 17, further comprising a period control word generator generating the period control word, wherein the second control signal is transmitted to the period control word generator.

19. The method of claim 17, wherein the delta-sigma modulator generating the carry signal according to the difference signal further comprises:

an accumulator receiving the difference signal from the adder, and generating the phase selection signal and the carry signal.

20. The method of claim 17, wherein the divider dividing the first clock into the second clock comprises the divider dividing the first clock by either P or P+1 according to the carry signal.

* * * * *